United States Patent [19]

Takahashi

[11] Patent Number: 4,659,225
[45] Date of Patent: Apr. 21, 1987

[54] PATTERN EXPOSURE APPARATUS WITH DISTANCE MEASURING SYSTEM

[75] Inventor: Kazuo Takahashi, Kawasaki, Japan

[73] Assignee: Canon Kabushiki Kaisha, Tokyo, Japan

[21] Appl. No.: 722,136

[22] Filed: Apr. 11, 1985

[30] Foreign Application Priority Data

Apr. 17, 1984 [JP] Japan ................................ 59-75806

[51] Int. Cl.$^4$ ........................ G01B 11/02; G03B 27/42
[52] U.S. Cl. ................................... 356/358; 356/363; 355/53
[58] Field of Search ............... 356/345, 357, 358, 373, 356/375, 363; 355/53; 354/77

[56] References Cited

U.S. PATENT DOCUMENTS 4,443,106 4/1984 Yasuda et al. ..................... 356/357

Primary Examiner—Eugene R. LaRoche
Assistant Examiner—David Mis
Attorney, Agent, or Firm—Fitzpatrick, Cella, Harper & Scinto

[57] ABSTRACT

An exposure apparatus wherein a semiconductor wafer is exposed to an IC circuit pattern formed on a mask through a reduction projection optical system, and then the wafer is stepped; and these operations are alternately repeated, thereby forming a plurality of patterns on the wafer. A distance measuring system utilizing the interference between laser beams, has a first mirror fixed relative to the mask and another mirror fixed relative to the wafer, so that the relative position between the mask and the wafer is determined by a single interferometer system.

5 Claims, 4 Drawing Figures

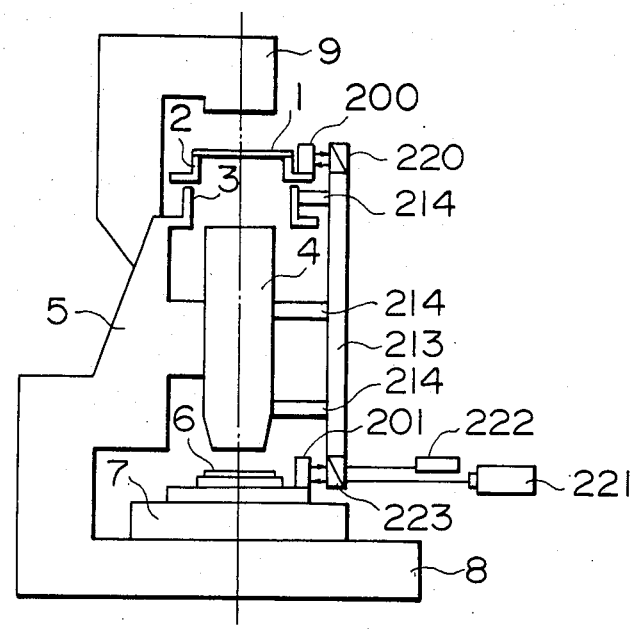
F I G. 3
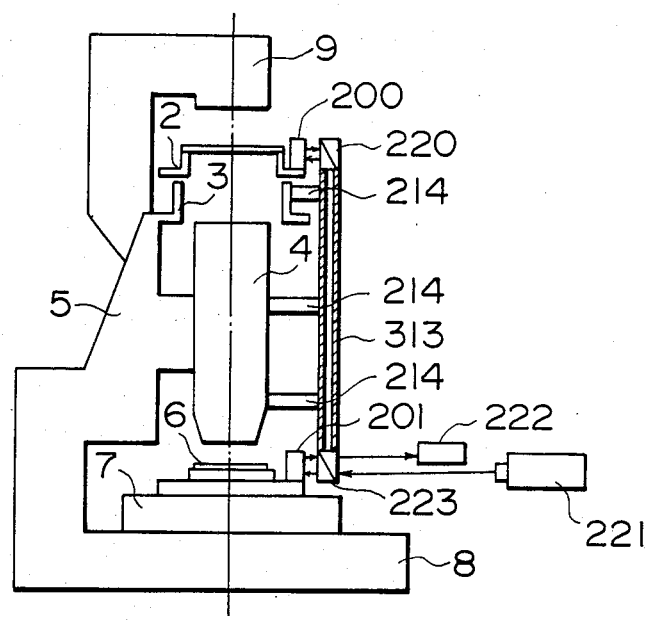
F I G. 4

4,659,225

PATTERN EXPOSURE APPARATUS WITH DISTANCE MEASURING SYSTEM

BACKGROUND OF THE INVENTION

The present invention relates to an exposure apparatus for transferring a pattern formed on one member to another member, particularly to an exposure apparatus wherein a semiconductor wafer is exposed to a pattern of an IC circuit formed on a reticle or a mask.

An apparatus of this type is known, for example, as a stepper wherein an IC circuit pattern formed on a reticle or a mask (hereinafter called simply a "mask") is projected onto a semiconductor wafer through a projection lens; the wafer is stepped for the next pattern projection; and these operations are repeated to expose a plurality of wafer portions to the pattern.

A typical example of this apparatus is shown in FIG. 1, wherein the apparatus comprises a frame 5 and a lens support 4 which is supported by the frame 5 and which supports a projection lens (not shown). A mask 1 is fixed in alignment with a reference 3 fixed on the frame 5 or the lens support 4. The apparatus further comprises a wafer stage 7 which supports a wafer 6 for movement in orthogonal directions (X and Y) directions. In order to regulate the step movement of the wafer 6 by the wafer stage 7, the change in the relative position between the wafer stage 7 and the lens support 4 is detected by a distance measuring system utilizing a laser interferometer. More particularly, a first mirror 10 is fixed to the lens support 4, while a second mirror 11 is fixed to the wafer stage 7. In association with these mirrors 10 and 11, a laser interferometer is provided, which includes a beam bender 20, a laser source 21, a detector 22 and an interferometer 23 affixed on a base 12. The laser beam produced by the laser source 21 is divided by the interferometer 23 into two beams in different directions. The respective beams reciprocate through a first and second optical systems which is constituted by the mirrors 10 and 11, respectively. Because of the optical path difference for the respective beams, a phase difference results and is detected by the detector 22. Thus, the amount of stage movement can be determined.

SUMMARY OF THE INVENTION

However, the above-described measuring system has a drawback. The mask stage 2 can move away from the position aligned with the reference 3 for one reason or another, or the reference position 3 itself can change in its position due to an influence of a vibration, heat or the like. If such happens, the above-described system can not recognize the change. Therefore, the relative position between the mask 1 and the wafer 6 may be deviated from a predetermined alignment after the wafer stage 7 is moved.

In order to avoid the drawback, it would be considered to provide an additional distance measuring system comprising a first mirror 110, a second mirror 111, a beam bender 120, a laser source 121, a detector 122 and an interferometer 123 which are corelated with each other in the same manner as in the above-described laser interferometer system. However, this increases the cost, and in addition, this system still can not meet a possible deformation of the lens support 4 or the frame 5 which functions as a reference.

Accordingly, it is a principal object of the present invention to provide a pattern exposure apparatus with a simple structure wherein the relative position or movement between a first object such as a mask and a second object such as a wafer can be precisely determined.

It is another object of the present invention to provide a pattern exposure apparatus with a simple structure wherein a pattern formed on a first object is projected on a second object through a reduction projection optical system, and wherein the pattern projection and the stepping movement of the second object are alternated repeatedly, so that the pattern is transferred repeatedly in different positions of the second object.

It is a further object of the present invention to provide a pattern exposure apparatus wherein the first object and the second object can be aligned with high precision.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 3 shows an apparatus according to a first embodiment of the present invention.

FIG. 4 shows an apparatus according to a second embodiment of the present invention.

DETAILED DESCRIPTION OF THE PREFERRED EMBODIMENTS

Figure 1:
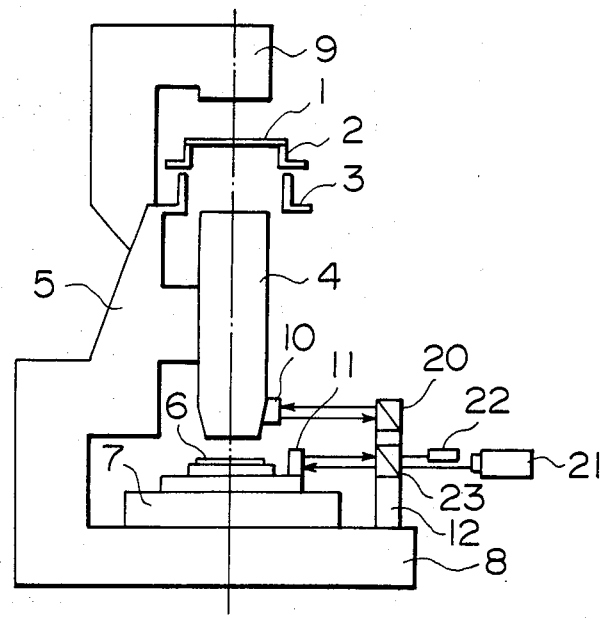
FIG. 1 shows an exposure apparatus which is conventional.
Figure 2:
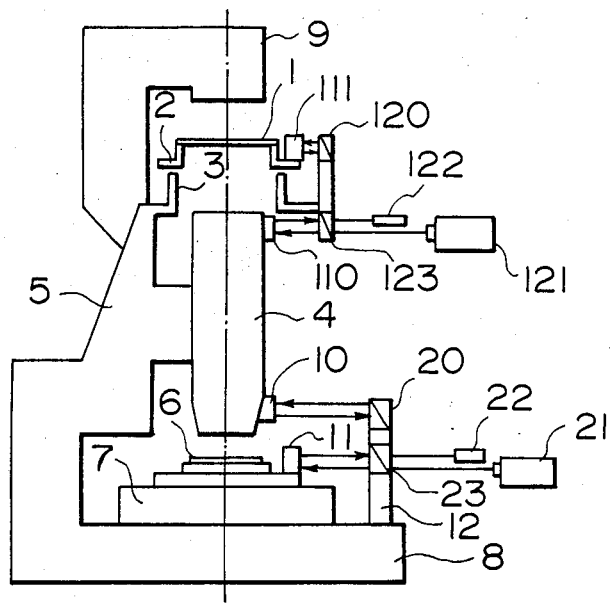
FIG. 2 illustrates a possible improvement over the FIG. 1 apparatus.

Referring now to FIG. 3, there is shown an apparatus according to the first embodiment of the present invention. In the Figures which will be referred to in the following description, the same reference numerals as in FIGS. 1 and 2, are assigned to the elements or means having the corresponding functions, and detailed explanation for those means are omitted for the sake of simplicity. Also, in the following description, two orthogonal directions in a plane perpendicular to the optical axis of the projection lens supported in the lens support 4 are referred to as X and Y directions.

As shown in FIG. 3, a mask 1 having an IC pattern is supported on a mask stage 2 which is movable in X and Y directions. The apparatus comprises a reference 3 for correctly positioning the mask 1, a projection lens which is supported in a lens support 4 and which is effective to image a pattern of the mask 1 on a semiconductor wafer 6 on a reduced scale, a frame 5, a wafer stage 7 which supports the wafer 6 for movement in X and Y directions, a base 8 and an illumination optical system for illuminating the mask 1 to project the mask pattern onto the wafer 6. The frame 5 fixedly supports thereon the lens support 4 and the illumination optical system 5 and movably supports the stages 2 and 7.

A first mirror 200 and a second mirror 201 are fixed to the mask stage 2 and wafer stage 7, respectively. The first and second mirrors constitute first and second optical systems in a laser interferometer, respectively. The apparatus further includes a third optical system 213 for constituting an optical path to introduce, to a beam bender 220, one of the laser beams, into which a laser beam is divided by a beam splitter provided in an interferometer 223. The third optical system 213 is made of quartz which is usable as an optical element. The interferometer 223 and the beam bender 220 are formed into a unit together with the third optical system 213. The third optical system 213 is fixed to the frame 5 or the lens support 4 by fixing elements 214 which may be of low-expansion material, such as low-expansion alloy, e.g., Invar (trademark). A laser source 221 produces a laser beam which is directed to the mirrors 200 and 201 through the interferometer 223. A detector 222 detects through the interferometer 223 the change in the phase difference between the laser beams reflected by the mirrors 200 and 201, respectively. The laser source 221, the interferometer 223 the mirrors 200 and 201 and the detector 222 constitute a distance measuring laser system.

The distance measuring system may be of a Michelson intereferometer type wherein the detector detects the change in the light intensity change pattern produced by the interference between the beams reflected by the mirrors 200 and 201, respectively. Also, it may be of a type wherein two laser beams produced by the laser source 221 and having slightly different wavelengths are separately projected to the mirrors 200 and 201 through the interferometer 223, and the detector 222 detects through the interferometer 223 the change in the beat frequency resulting from the Doppler effect caused by movement of one of the stages 2 and 7.

The distance measuring operation will now be explained in connection with the latter type. The laser source 221 produces a laser beam having a component of the frequency f1 and a component of the frequency f2, respectively, the frequency f2 is slightly different from the frequency f1. The two components are differently polarized, such that the direction of polarization is shifted by 90 degrees. The interferometer 223 of this type includes a polarization beam splitter and a corner cube reflecting mirror. It further includes $\frac{1}{4}$ wafelength plate between the mirror 200 and the interferometer 223.

The laser beam thus produced is divided by the beam splitter in the interferometer 223 into two beams which are directed upwardly and leftwardly, as seen in the Figure. The upward beam transmits through the third optical system of quartz 213 and is deflected by the beam bender 220 having an inclined reflecting surface, and then is incident on the mirror 200. The beam is reflected by the mirror 200 to trace back by way of the beam bender 220, the third optical system 213 and the beam splitter in the interferometer 223, thus reaching the detector 220. On the other hand, the leftward beam is incident on the mirror 201 through the $\frac{1}{4}$ wavelength plate. The beam reflected by the mirror 201 passes through the $\frac{1}{4}$ wavelength plate again so that the direction of polarization thereof is changed 90 degrees with respect to the incident beam from the interferometer 223. The thus polarized beam is incident on the interferometer 223. The laser beam is polarized by 90 degrees, and therefore, it is reflected by the beam splitter in the interferometer 223, and further reflected by a mirror in the interferometer 223 with the result that it is incident on the mirror 201 again. The beam reflected by the mirror 201 is again polarized by 90 degrees by the $\frac{1}{4}$ wavelength plate, and then is incident on the interferometer 223. During these two reciprocations, the laser beam is polarized by 180 degrees so as to be allowed to pass through the polarization beam splitter in the interferometer 223 and to be incident on the detector 222, where a signal is produced which is responsive to the beat frequency (f1±Δf1−f2) produced by the beams reflected by the mirrors 200 and 201, respectively (±Δf1 is the change of the frequency f1 resulting from the Doppler effect in accordance with movement of one of the stages 2 and 7). Since the beat frequency (f1−f2) resulting from the two laser beams produced by the laser source 221 is determined by directly detecting the output of the laser source 221, it is possible to obtain only ±Δf1 from the output of the detector 222. A processor contained in the detector 222 can provide ±Δf1 and determine the amount of relative movement between the stages 2 and 7 on the basis of the wavelength of the laser beam and a time-integrated ±Δf1. Thus, the relative position between the mirror 200 and the mirror 201, and therefore, the relative position between the mask stage 2 and the wafer stage 7, is obtained.

As described in the foregoing, the positional relation between the mask stage 2 and the wafer stage 7 is directly determined with high precision by locating first and second mirrors of a single distance measuring laser system to the mask stage 2 and the wafer stage 7, respectively.

In this embodiment, the apparatus is less vulnerable to ambient conditions by coupling the beam bender 20 with the interferometer 223 by the third optical system 213.

FIG. 4 shows another embodiment of the apparatus according to the present invention, which is different from the first embodiment in that the optical path in a hollow member 313 of low-expansion metal is employed in place of the third optical system 213 of the first embodiment.

As described in the foregoing, the relative position between the mask stage and the wafer stage is directly measured by a single distance measuring system, so that the relative position can be assured without resort to the other means, for example, the reference on the frame or the lens support. Therefore, by servo-controlling one of the wafer stage and the mask stage on the basis of the above measurement, the relative position can be maintained against an unexpected disturbance. Further, since the third optical system for optically coupling the first optical system and the second optical system comprises quartz which is utilized as the optical path for the laser beam, the possible error in the distance measurement can be minimized which may otherwise result from variation in the ambient conditions.

It is a possible alternative that the interferometer is located substantially in the middle of the third optical system 213 of FIG. 3, whereby the distance measuring system is substantially symmetrical, so that the influence of temperature change to the coupling members can be compensated, further minimizing the influence by the disturbance, such as temperature variation.

The third optical system 213 may be of low-expansion glass. The hollow member 313 may be of Invar, Super-Invar or low-expansion ceramic material. Additionally, the output of the detector 222 may be used for alignment between the mask 1 and the wafer 4, which is to be effected by an alignment apparatus (not shown).

While the invention has been described with reference to the structures disclosed herein, it is not confined to the details set forth and this application is intended to cover such modifications or changes as may come within the purposes of the improvements or the scope of the following claims.

What is claimed is:

1. An apparatus for projecting a pattern formed on a first object onto a second object, said apparatus comprising:

first supporting means for supporting the first object;

second supporting means for supporting the second object;

means for projecting the pattern of the first object supported by said first supporting means, onto the second object supported by said second supporting means; and means for detecting a positional relation between said first and second supporting means, said detecting means having a light source, a first reflection optical system mounted on said first supporting means, a second reflection optical system mounted on said second supporting means, and a detector for detecting interference between light emitted from said light source and reflected by said first reflection optical system and light emitted from said light source and reflected by said second reflection optical system.

2. An apparatus according to claim 1, wherein said detecting means further includes a light guide made of a low-expansion material, for guiding at least one of the lights reflected by said first and second reflection optical systems, respectively.

3. An apparatus according to claim 2, wherein said light guide is fixed integrally to said projecting means by a fixing member made of a low-expansion material.

4. An apparatus according to claim 3, wherein said light guide is made of a low expansion material selected from the group comprising quartz, low-expansion ceramics, low-expansion alloy and super low-expansion alloy.

5. An apparatus according to claim 1, wherein said first and second supporting means are moveable relative to each other so as to permit alignment of the first and second objects with each other.

* * * * *

UNITED STATES PATENT AND TRADEMARK OFFICE
CERTIFICATE OF CORRECTION

PATENT NO. : 4,659,225  
DATED : April 21, 1987  
INVENTOR(S) : KAZUO TAKAHASHI

Page 1 of 2

It is certified that error appears in the above-identified patent and that said Letters Patent is hereby corrected as shown below:

COLUMN 1

Line 25, "orthogonal directions" should read --orthogonal--.

COLUMN 2

Line 59, "5" should be deleted.

COLUMN 3

Line 13, "223 the" should read --223, the--.  
    Line 37, "reflecting" should read --reflecting--.  
    Line 37, "wafelength" should read --wavelength--.

COLUMN 4

Line 24, "20" should read --220--.  
    Line 52, "to" should read --on--.  
    Line 60, "4," should read --6,--.

UNITED STATES PATENT AND TRADEMARK OFFICE
CERTIFICATE OF CORRECTION

PATENT NO. : 4,659,225

DATED : April 21, 1987

INVENTOR(S) : KAZUO TAKAHASHI

It is certified that error appears in the above-identified patent and that said Letters Patent is hereby corrected as shown below:

<u>COLUMN 6</u>

Line 12, "low expansion" should read --low-expansion--.
Line 14, "super low-expansion" should read --super-low-expansion--.
Line 17, "moveable" should read --movable--.

Signed and Sealed this

Twenty-ninth Day of September, 1987

Attest:

DONALD J. QUIGG

*Attesting Officer*   *Commissioner of Patents and Trademarks*